(12) United States Patent
Lloyd

(10) Patent No.: US 6,496,050 B2
(45) Date of Patent: Dec. 17, 2002

(54) SELECTIVE MODIFICATION OF CLOCK PULSES

(75) Inventor: Alan Lloyd, Bristol (GB)

(73) Assignee: STMicroelectronics Limited, Bristol (GB)

(*) Notice: Subject to any disclaimer, the term of this patent is extended or adjusted under 35 U.S.C. 154(b) by 0 days.

(21) Appl. No.: 09/888,043

(22) Filed: Jun. 21, 2001

(65) Prior Publication Data

US 2002/0053937 A1 May 9, 2002

(30) Foreign Application Priority Data

Jun. 21, 2000 (GB) ............................................. 0015231

(51) Int. Cl.$^7$ ......................... H03K 17/62; H03K 3/356
(52) U.S. Cl. ....................................... 327/407; 327/212
(58) Field of Search ................................ 327/407, 403, 327/291, 299, 199, 211, 212

(56) References Cited

U.S. PATENT DOCUMENTS

| 5,250,858 A | 10/1993 | Strong | 307/465 |
|---|---|---|---|
| 5,295,174 A * | 3/1994 | Shimizu | 327/407 |
| 5,327,019 A | 7/1994 | Kluck | 307/272.1 |
| 5,537,062 A | 7/1996 | Mote, Jr. | 326/93 |
| 5,652,536 A | 7/1997 | Nookala et al. | 327/298 |
| 5,811,985 A | 9/1998 | Trimberger et al. | 326/38 |
| 5,821,794 A | 10/1998 | Nazarian et al. | 327/298 |
| 6,300,809 B1 * | 10/2001 | Gregor et al. | 327/407 |
| 6,362,680 B1 * | 3/2002 | Barnes | 327/407 |

FOREIGN PATENT DOCUMENTS

| EP | 0144558 A2 | 6/1985 |
|---|---|---|
| EP | 0722220 A1 | 7/1996 |
| JP | 09009098 | 10/1997 |

* cited by examiner

Primary Examiner—Toan Tran
(74) Attorney, Agent, or Firm—Lisa K. Jorgenson; Robert Iannucci; Seed IP Law Group PLLC

(57) ABSTRACT

A circuit for modifying a clock pulse train is described. The circuit has an input for receiving the clock pulse train, a first logic circuit having an output which is responsive to a clock pulse edge of a first polarity and a second logic circuit having an output which is responsive to a clock pulse edge of a second polarity. A two input multiplexer is provided to receive respectively the outputs of the first and second logic circuits and is arranged to provide an output representing a modification of the input clock pulse train.

10 Claims, 2 Drawing Sheets

US 6,496,050 B2

SELECTIVE MODIFICATION OF CLOCK PULSES

TECHNICAL FIELD

The present invention relates to a circuit for modifying a clock pulse train, and more particularly but not exclusively to such a circuit in which a clock pulse train can be selectively supplied and, if supplied can be selectively inverted.

BACKGROUND TO THE INVENTION

It is a known requirement to provide a gated clock pulse train which can be inverted or not according to user requirements. A known circuit receiving a clock pulse train and operable to either provide no clock, a true clock or an inverted clock has a disadvantage of different propagation times through the circuit depending on whether the clock is inverted or not. Known circuits also may present problems such as glitches when switching between inverting and non-inverting clocks.

It is accordingly an object of the present invention to at least partially mitigate the difficulties of the prior art.

SUMMARY OF THE INVENTION

According to the present invention there is provided a circuit for modifying a clock pulse train, the circuit comprising a input for said clock pulse train, a first logic circuit having an output which is responsive to a clock pulse edge of a first polarity, a second logic circuit having an output which is responsive to a clock pulse edge of a second polarity opposite to said first polarity and a two-input multiplexer having a control input coupled to receive said clock pulse train, the first input of the multiplexer receiving the output of the first logic and the second input of the multiplexer receiving the output of the second logic circuit.

Preferably the first logic circuit comprises a first latch circuit having an input and said second logic circuit comprises a second latch circuit having an input, the circuit further comprising a control input terminal connected to said input of said first latch and to said input of said second latch via respective paths, the propagation delay difference between said path being less than the period of a clock pulse.

According to a second aspect of the present invention there is provided a circuit for selectively modifying a clock pulse train, the circuit comprising an input for said clock pulse train, a first clocked latch having an input, an output and a clock terminal, a second clocked latch having an input, an output and a clock terminal, and a two input multiplexer having a control input connected to receive said clock pulse train, the first input of the multiplexer being connected to the output of the first latch and the second input of the multiplexer being connected to the output of the second latch, said input for said clock pulse train being connected to the clock input terminals of said first and second latches wherein the first latch is responsive to a rising edge in said clock pulse train and the second latch is responsive to a falling edge in said clock pulse train.

Preferably the circuit comprises a control input and an enable input, and first logic circuitry connecting said control input and said enable input to the input of said first latch and second logic circuitry connecting said control input and said enable input to the input of said second latch.

Conveniently said logic circuitry comprises a two input AND gate receiving said control input and enable input at its two inputs and said first logic circuitry comprises a two input AND gate receiving at its two inputs said enable input and the inverse of the said control input.

An embodiment of the present invention will be described by way of example only with reference to the accompanying drawings.

DETAILED DESCRIPTION OF THE INVENTION

Figure 1:
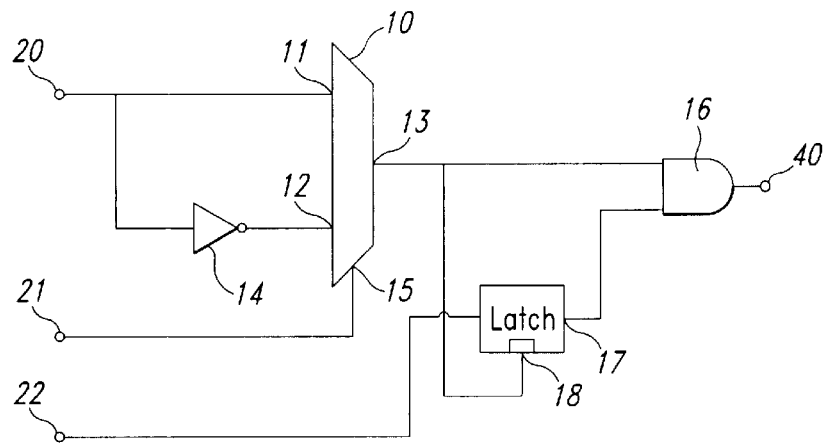
FIG. 1 shows a schematic diagram of a clock gating circuit according to the prior art.

In the Figures like reference numerals refer to like parts.

Referring first to FIG. 1, a prior art circuit comprises a two-input multiplexer 10 having a first input 11, a second input 12 and an output 13. The first input 11 is directly connected to a clock node 20 and the clock node 20 is connected to the second input 12 via an inverter 14. The multiplexer 10 has a control terminal 15 which is connected to a control node 21. The output 13 of the multiplexer 10 is connected to an output terminal 40 via a two-input AND gate 16, whose other input is connected to the output of a latch 17. The input of the latch 17 is provided at an enable input 22 and the latch is clocked at a clock node 18 by the output of the multiplexer 13.

To explain the operation, consider first the situation where the control input is at logic 1. In this case, the first input 11 to the multiplexer is connected directly to the output 13 of the multiplexer. Thus, the clock pulse train incident at the clock pulse node 20 appears directly at the output 13 of the multiplexer.

In the alternative situation, when the control node is at logic zero, the multiplexer connects its second input 12 to its output 13. From inspection of the circuit it will be seen that the clock pulse train appears at the second input terminal 12 after passing through the inverter 14 and thus the second multiplexer input receives an inverted version of the clock for output from the output terminal 13 of the multiplexer 10.

It will however be appreciated by those skilled in the art that there is a propagation delay difference between the two paths for the true and inverse clock. This is due to the delay caused by the inverter 14. Equally, in the known circuit, it is quite hard to change clock orientation. For example to change over it is necessary to ensure the input at enable input 22 is de-asserted, then wait for the end of the clock cycle before altering the state of control input 21 to avoid glitches.

The output 13 of the multiplexer 10 is, as has previously been noted, provided to one input of the two-input AND gate 16, and also to the clock input of latch 17. Further reference to FIG. 1 shows that the latch 17 is transparent while the clock input is low and latches while the clock input is high. Thus, while the enable input 22 is at a low level, the input to the latch 17 is low and the output of the latch 17 remains permanently low thereby causing the output terminal 40 to be constantly at logic zero. When the enable input 22 is high then the output of the latch 17 is permanently high so that the output 40 changes state with changes at the state at the output 13 of the multiplexer 10 after the gate delay of the AND gate 16. If the enable input 22 changes state during a positive going half cycle of the clock input at terminal 18 of the latch 17, then the clock pulse at output 40 will either continue (if previously enabled) until the end of the instant clock pulse or will not be enabled (if previously disabled) until the end of the clock pulse at output 13.

It will be noted that changes of state at enable input 22 only take effect while the clock terminal 18 is at a low level and thus do not provide any effect until the next high state of the clock at node 13.

Figure 2:
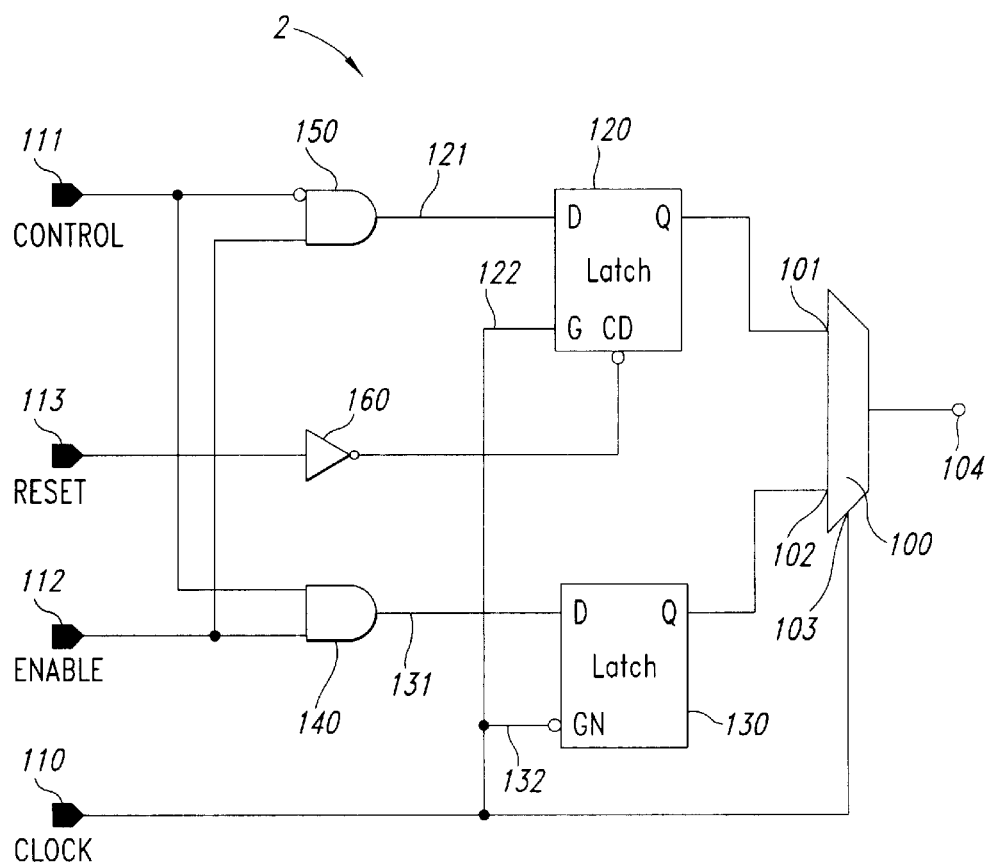
FIG. 2 shows an embodiment of a circuit for selectively inverting a clock pulse train in accordance with the present invention.

Turning now to FIG. 2, an embodiment of a clock pulse modification circuit 2 consists of a two-input multiplexer 100 having a first input 101, a second input 102, a select input 103 and an output connected to a circuit output 104. The circuit has a clock terminal 110 connected in use to receive a clock pulse train and the clock terminal is connected to the select input 103 of the two-input multiplexer 100. The first input 101 of the two-input multiplexer 100 is supplied from the output of a first latch 120 and the second input 102 is supplied from the output of a second latch 130. The circuit 2 has a control input 111 and an enable input 112, together with a reset input 113. The second latch 130 has an input 131 which is provided by the output of a first two-input AND gate 140 which is connected with a first input to the enable input terminal 112 and its second input to the control input 111. The input 121 of the first latch 120 is provided by the output of a two-input gating circuit 150 which receives at a first input the control input 111 and at a second input the enable input 112. The gating circuit 150 provides an AND function of the inverse of the control input 111 and the true enable input 112. The first latch 120 has a clock input node 122 connected to the clock terminal 110 and the second latch 130 has a clock node 132 likewise connected to the clock terminal 110. However, the first latch 120 responds to positive-going edges of clock pulses at the clock terminal 110 whereas the second latch 130 responds to the negative-going edges of clock pulses at clock terminal 110.

The reset input 113 via an inverter 160, is connected to a 'clear data' input of first latch 120. This ensures that when the clock is disabled a known output at circuit output 104 is present. In the embodiment, when the clock input is low, the first latch 120 is off which means that mode 101 would be at an unknown value at power-up. Adding reset input (at high after power-up) means that 101 starts at a known (zero) level.

It would alternatively be possible to connect the output of the inverter 160 to a 'set data' input of the second latch 130 to ensure starting at logic 1. Other start arrangements will be clear to those skilled in the art.

Figure 3:
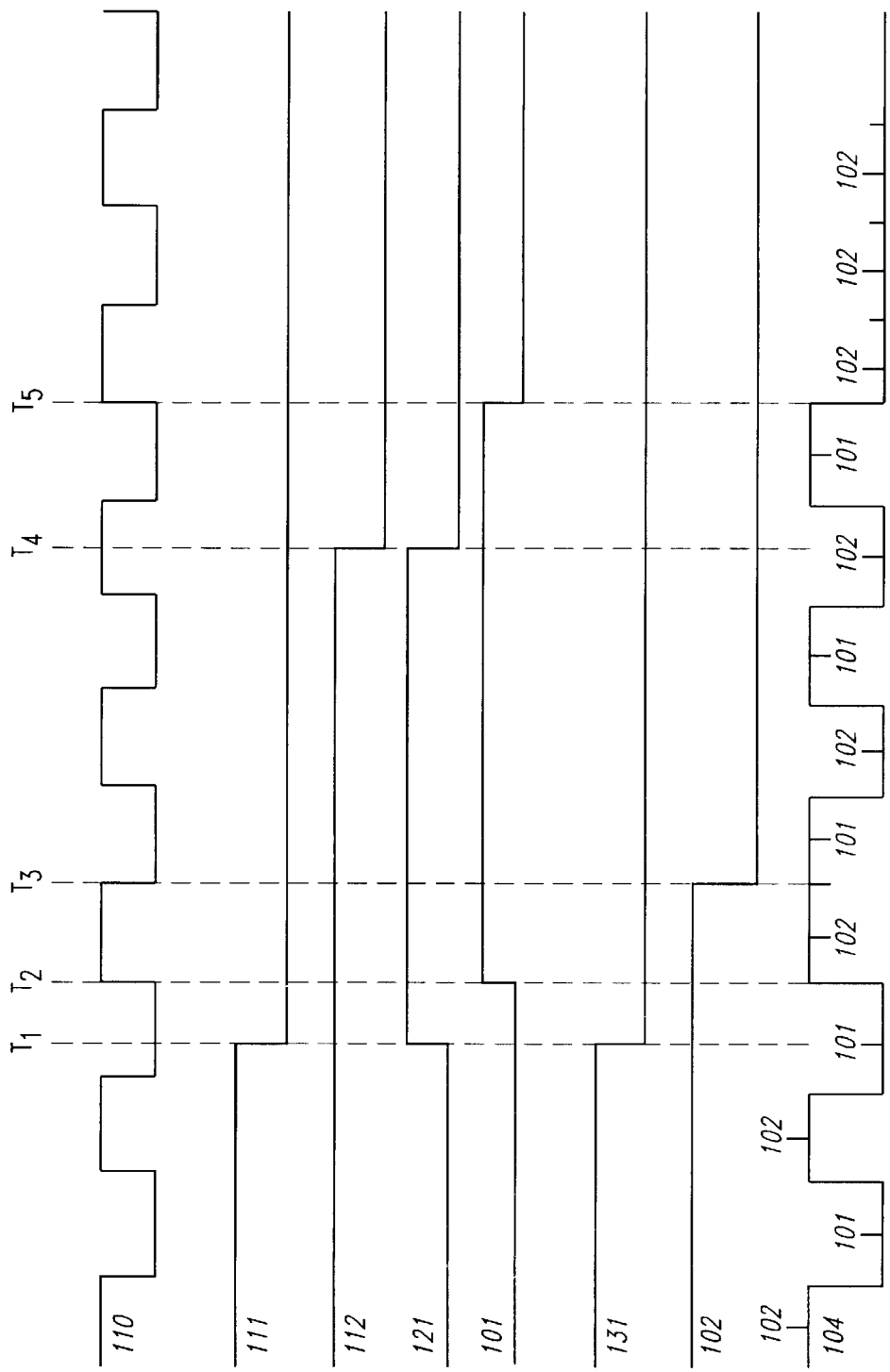
FIG. 3 shows a timing diagram useful in understanding the embodiment of FIG. 2.

Turning now to FIG. 3, the operation of the circuit will now be described.

The top waveform shows the clock pulses at the clock terminal 110, which is shown here as having a unity mark-two-space ratio. The second tray shows the control input 111 which starts at logic 1 before falling to logic zero at time T1. The enable input 112 is the third waveform which starts at logic one and falls to logic zero at time T4. The fourth waveform is the input 121 to the first latch 120 which changes substantially at the same instant as the change of the control input 111 but instead changes from logic zero to logic one at substantially time T1. It will be recalled that the first latch responds to the rising edge of the clock pulse train and thus the output 101 (fifth waveform) of the first latch does not change state to logic 1 until time T2, around a quarter of a clock cycle later than time T1, when the clock pulse 110 has a rising edge. The sixth waveform shows the input 131 to the second latch. This input substantially follows the control input 111 but, as it will be recalled that the second latch 130 responds to the falling edge of the clock waveform the output 102 (seventh waveform) of the latch remains at logic one until time T3 around three quarters of a clock period after T1, at the next falling edge of the clock.

At time T4 the enable input 112 falls to the logic zero disable state and this change of state does not appear at the output 101 of the first latch 120 until time T5, around three quarters of a clock period later, at the next rising clock edge.

The last waveform on FIG. 3 shows the clock pulse output at terminal 104. Operation of the multiplexer causes the output to be derived from sequential segments of the two inputs, 101, 102 to the multiplexer. Until time T3, the first input 101 to the multiplexer is at logic zero and the second input 102 to the multiplexer is at logic one. However, at time T1 the input to the first latch changes state and at the next rising edge T2 the latch output changes state to logic one so that sufficient time is available for the latch output to settle before one half clock period later, at time T3 the multiplexer switches between logic one from the second input 102 to logic one from the first input 101. Thereafter, it will be seen that the clock pulse is inverted until time T5 when the enable input causes both latches to have logic zero outputs. Once again, it will be seen that the transition in the enable input gives sufficient time for the latch output to stabilize at logic zero before that logic zero is passed by the multiplexer.

A fundamental feature of this embodiment is that because the multiplexer is controlled by the clock state, and the latches respond to clock edges, the multiplexer always connects a stable input to the output. The unselected input receives a possibly changing level, but this is not passed through to the output.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A circuit for selectively modifying a clock pulse train, the circuit comprising:

an input for said clock pulse train;

a clocked first latch having an input, an output and a clock terminal;

a clocked second latch having an input, an output and a clock terminal;

a two input multiplexer having a control input connected to receive said clock pulse train, a first input connected to the output of the first latch, and a second input connected to the output of the second latch, said input for said clock pulse train being connected to the clock terminals of said first and second latches wherein the first latch is responsive to a rising edge in said clock pulse train and the second latch is responsive to a falling edge in said clock pulse train; and a control input, an enable input, first logic circuitry connecting said control input and said enable input to the input of said first latch, and second logic circuitry connecting said control input and said enable input to the input of said second latch.

2. The circuit of claim 1 wherein said second logic circuitry comprises a two input AND gate receiving said control input and enable input at its two inputs and said first logic circuitry comprises a two input AND gate receiving at its two inputs said enable input and the inverse of said control input.

3. The circuit of claim 2 having a start input for causing said circuit output to be at a predetermined level when the clock pulse train is not provided.

4. The circuit of claim 3 wherein said first latch has a reset input responsive to said start input, whereby the output of said first latch is set to a predetermined logic level during start-up.

5. A method of selectively modifying a clock pulse train, the method comprising:

receiving the clock pulse train at respective inputs of first and second logic circuits having respective outputs;

selectively enabling the first logic circuit with a first enable signal, thereby causing the first logic circuit, when enabled, to output a first portion of the clock pulse train;

selectively enabling the second logic circuit with a second enable signal, thereby causing the second logic circuit, when enabled, to invert a second portion of the clock pulse train and output the inverted second portion; and alternately electrically connecting to an output terminal either the output of the first logic circuit or the output of the second logic circuit depending on a logic level of the clock pulse train.

6. The method of claim 5, further comprising causing the first logic circuit to output a signal at a predetermined logic level in response to a reset signal.

7. The method of claim 5 wherein the first and second logic circuits are latches.

8. The method of claim 5 wherein the first enable signal enables the first logic circuit if a first control signal is at a first logic level and a second control signal is at a second logic level and the second enable signal enables the second logic circuit if both of the first and second control signals are at the second logic level.

9. The method of claim 5 wherein the alternately electrically connecting step is performed by a multiplexer having a first input coupled to the output of the first logic circuit, a second input coupled to the output of the second logic circuit, an output coupled to the output terminal, and a control input coupled to the clock pulse train.

10. A circuit for modifying a clock pulse train, the circuit comprising:

an input for said clock pulse train;

a first logic circuit having an output which is responsive to a first clock pulse edge of the clock pulse train, the first clock pulse edge having a first polarity;

a second logic circuit having an output which is responsive to a second clock pulse edge of the clock pulse train, the second clock pulse edge having a second polarity opposite to said first polarity;

a two-input multiplexer having an output as an output of said circuit, a control input coupled to receive said clock pulse train, a first input receiving the output of the first logic circuit, and a second input receiving the output of the second logic circuit;

a control input;

an enable input;

third logic circuitry connecting said control input and said enable input to the input of said first logic circuit; and fourth logic circuitry connecting said control input and said enable input to the input of said second logic circuit.

* * * * *